United States Patent
Pentakota

(10) Patent No.: US 8,217,691 B2
(45) Date of Patent: Jul. 10, 2012

(54) LOW POWER CLOCKING SCHEME FOR A PIPELINED ADC

(75) Inventor: Visvesvaraya A. Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 304 days.

(21) Appl. No.: 12/645,165

(22) Filed: Dec. 22, 2009

(65) Prior Publication Data

US 2011/0102033 A1    May 5, 2011

(30) Foreign Application Priority Data

Oct. 30, 2009   (IN) .......................... 2641/CHE/2009

(51) Int. Cl.
*H03L 7/06* (2006.01)
*H03L 7/093* (2006.01)

(52) U.S. Cl. .................. 327/157; 327/148; 327/158

(58) Field of Classification Search ................. 327/148, 327/149, 157, 158
See application file for complete search history.

(56) References Cited

U.S. PATENT DOCUMENTS

| | | | |
|---|---|---|---|
| 4,922,141 A | 5/1990 | Lofgren et al. | |
| 5,663,686 A * | 9/1997 | Tada | 331/8 |
| 5,699,387 A * | 12/1997 | Seto et al. | 375/376 |
| 6,792,064 B2 * | 9/2004 | Nakamura | 375/376 |
| 7,082,176 B2 * | 7/2006 | Chien et al. | 375/374 |
| 7,479,816 B2 | 1/2009 | Lee et al. | |
| 7,498,856 B2 * | 3/2009 | Lin et al. | 327/156 |
| 7,567,103 B2 | 7/2009 | Park et al. | |
| 2006/0045222 A1 | 3/2006 | Kim et al. | |
| 2008/0130177 A1 | 6/2008 | Vlasenko et al. | |

* cited by examiner

*Primary Examiner* — Patrick O'Neill
(74) *Attorney, Agent, or Firm* — John J. Patti; Wade J. Brady, III; Frederick J. Telecky, Jr.

(57) ABSTRACT

Delay locked loops or DLLs are oftentimes employed in pipelined analog-to-digital converters (ADCs). Conventional DLLs, though, can consume an excessive amount of power. Here, a DLL is provided with a modified charge pump that allows for reduced power consumption.

15 Claims, 4 Drawing Sheets

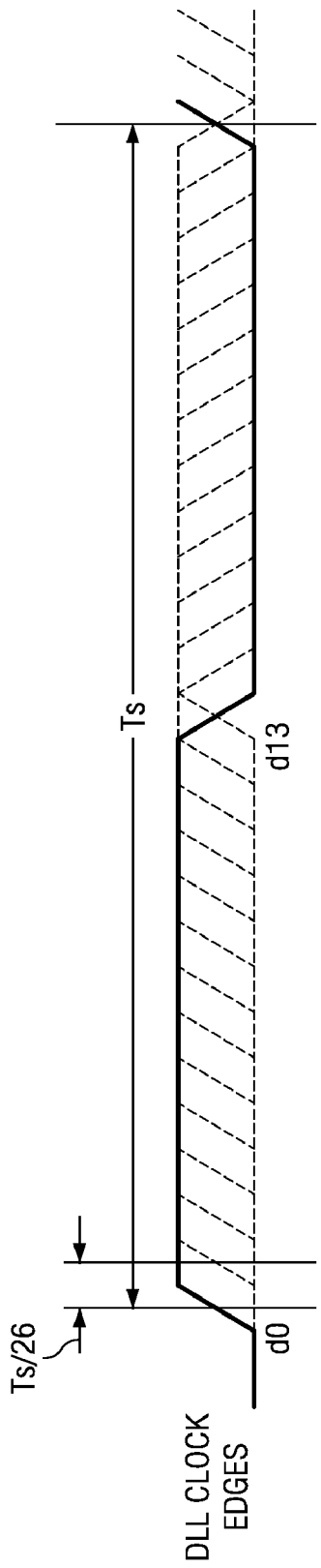
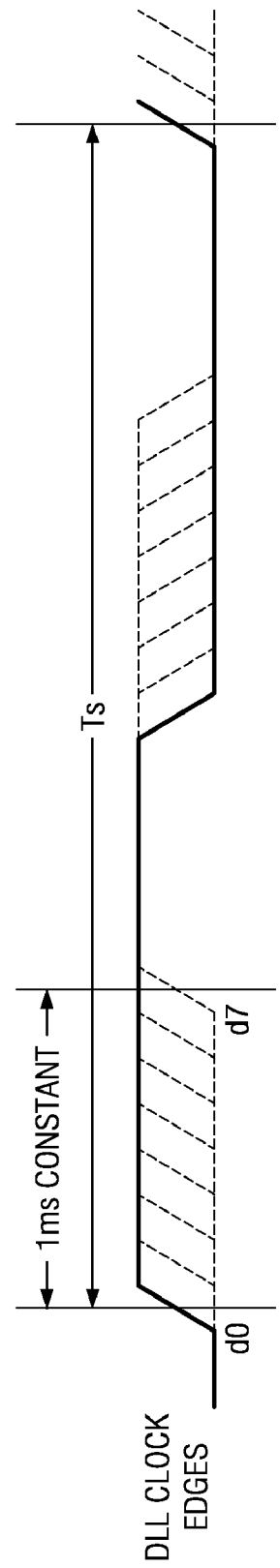

LOW POWER CLOCKING SCHEME FOR A PIPELINED ADC

CROSS-REFERENCE TO RELATED APPLICATIONS

This application claims priority from Indian Application No. 2641/CHE/2009, filed Oct. 30, 2009, which is hereby incorporated by reference for all purposes

TECHNICAL FIELD

The invention relates generally to delay locked loop (DLL) and, more particularly, to a DLL employed in a pipelined analog-to-digital converter (ADC).

BACKGROUND

Switched capacitor circuit implementations of pipelined analog-to-digital converters (ADCs) employ non-overlapping clock signals for operation. Conventional clock generation techniques are highly dependant on process and temperature. Here, the non-overlap is supposed to be a fraction of the clock period across process and temperature. The non-overlap period keeps increasing with the clock period $T_S$ (where $T_S = 1 F_S$ with $F_S$ being ADC's operating speed). So the time available to charge the sampling capacitor to input voltage (sample-time) and the time available for the amplifier in the multiplying digital-to-analog converter (MDAC) to settle to its final value (hold-time) remain a constant fraction of the clock period $T_S$. A significant fraction of the total power in a pipelined ADC is spent on the amplifiers in the MDACs to obtain acceptable bandwidths (acceptable settling errors).

Several different clock generation techniques exist. An example is a delay locked loop (DLL). Turning to FIG. 1A, an example of a conventional DLL 100 can be seen. DLL 100 generally comprises a duty cycle controller 102, a delay line 104, a phase detector (PD) 106, a charge pump, and a loop filter. As shown, delay line 104 is generally comprised of delay elements 112-1 to 112-N coupled in series with one another, while the charge pump is generally comprised of switches S1 and S2 and current sources 108 and 110. In operation, the duty cycle controller 102 receives a clock signal with a period $T_S$ and provides a clock signal CLKIN to the PD 106 and delay line 104, and the delay line 104 provides a feedback signal FB to the PD 106 from one of its delay elements 112-1 to 112-N. Based on the feedback signal FB and the clock signal CLKIN, the PD 106 generates symmetrical pulses for switches S1 and S2 so that current sources 108 and 110 (which each provide currents having the same general magnitude) can drive a current onto a plate of capacitor CF, resulting in a particular control voltage VCNTL on control node NCNTL. This control voltage VCNTL is then provided to each of the delay elements 112-1 to 112-N so as to control the operation of the delay line 104.

For an example operation of conventional DLL 100, assume that output edges to be at $$\frac{T_S}{26}$$

apart (which can be seen in FIG. 1B), the delay line would have 13 delay elements or buffers (i.e., 112-1 to 112-13). If the output of the first through thirteenth buffers are referred to as d1 to d13 (respectively), PD 106 of DLL 100 would compare the clock signal CLKIN to the output from the thirteenth delay element d13. When DLL 100 has converged such that the control voltage VCNTL has stabilized, up and down pulses provided to switches S1 and S1 of DLL 100 are of equal width or are symmetrical (very small compared to period $T_S$) and would be overlapping.

Some other conventional circuits are: U.S. Pat. No. 7,479,816; U.S. Pat. No. 4,922,141; U.S. Pat. No. 7,567,103; U.S. Patent Pre-Grant Publ. No. 2008/0130177; and U.S. Patent Pre-Grant Publ. No. 2006/0045222.

SUMMARY

A preferred embodiment of the present invention, accordingly, provides an apparatus. The apparatus comprises a phase detector (PD) that receives a first signal and a second signal; a charge pump having: a first current source that supplies a first current; a first switch that is coupled between the first current source and a control node, wherein the first switch is controlled by the PD; a second current source that supplies a second current, wherein the first current is the different between a generally constant current and the second current; and a second switch that is coupled between the second current source and the control node, wherein the second switch is controlled by the PD; and a delay line that receives the first signal, that is coupled to the control node, and that is coupled to the PD so as to provide the second signal to the PD.

In accordance with a preferred embodiment of the present invention, the first current source further comprises a plurality of current sources.

In accordance with a preferred embodiment of the present invention, the apparatus further comprises a duty cycle controller that receives a clock signal and that is coupled to the delay line and PD so as to provide the first signal to the delay line and PD.

In accordance with a preferred embodiment of the present invention, the delay line further comprises a plurality of delay elements coupled in series with one another, wherein each delay element is coupled to the control node.

In accordance with a preferred embodiment of the present invention, each of the delay elements further comprises a buffer.

In accordance with a preferred embodiment of the present invention, the loop filter further comprises a capacitor.

In accordance with a preferred embodiment of the present invention, an apparatus is provided. The apparatus comprises sample-and-hold (S/H) circuitry that receive an analog input signal; an analog-to-digital converter (ADC) that is coupled to the S/H circuitry; and clocking circuitry that is coupled to the S/H circuitry and ADC so as to provide clocking signals to the S/H circuitry and the ADC, wherein the clocking circuitry includes a delay locked loop (DLL) having: a PD that receives a first signal and a second signal; a charge pump having: a first current source; a first switch that is coupled between the first current source and a control node, wherein the first switch is controlled by the PD; a second current source; a second switch that is coupled between the second current source and the control node, wherein the second switch is controlled by the PD; and a third current source that is coupled between the first current source and ground; a loop filter that is coupled to the control node; and a delay line that receives the first signal, that is coupled to the control node, and that is coupled to the PD so as to provide the second signal to the PD.

In accordance with a preferred embodiment of the present invention, the clocking circuitry further comprises a clock generator that is coupled to each of the delay elements and that is coupled to the ADC.

In accordance with a preferred embodiment of the present invention, the clocking circuitry further comprises a clock buffer that is coupled to the DLL.

In accordance with a preferred embodiment of the present invention, the S/H circuitry further comprises: a sampling switch that receives the analog input signal and that is controlled by the clocking circuitry; and a sampling capacitor that is coupled to the sampling switch and the ADC.

In accordance with a preferred embodiment of the present invention, an apparatus is provided. The apparatus comprises a sampling switch that receives the analog input signal; a sampling capacitor that is coupled to the sampling switch; an analog-to-digital converter (ADC) that is coupled to the sampling capacitor; a clock buffer; a delay circuit that is coupled to the clock buffer and the sampling switch so as to control the sampling switch; a delay locked loop (DLL) having: a duty cycle controller that is coupled to the clock buffer; a PD that is coupled to the duty cycle controller; a charge pump having: a first current source; a first switch that is coupled between the first current source and a control node, wherein the first switch is controlled by the PD; a second current source; a second switch that is coupled between the second current source and the control node, wherein the second switch is controlled by the PD; and a third current source that is coupled between the first current source and ground; a capacitor that is coupled between the control node and ground; and a plurality of delay elements coupled in series with one another, wherein each delay element is coupled to the control node, and wherein at least one of the delay elements is coupled to the duty cycle controller, and wherein at least one of the delay elements is coupled to the PD; and a clock generator coupled to each of the delay elements and coupled to the ADC.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1B is a timing diagram for the DLL of FIG. 1A;

FIG. 3B is a timing diagram for the DLL of FIG. 3A.

DETAILED DESCRIPTION

Figure 1A:
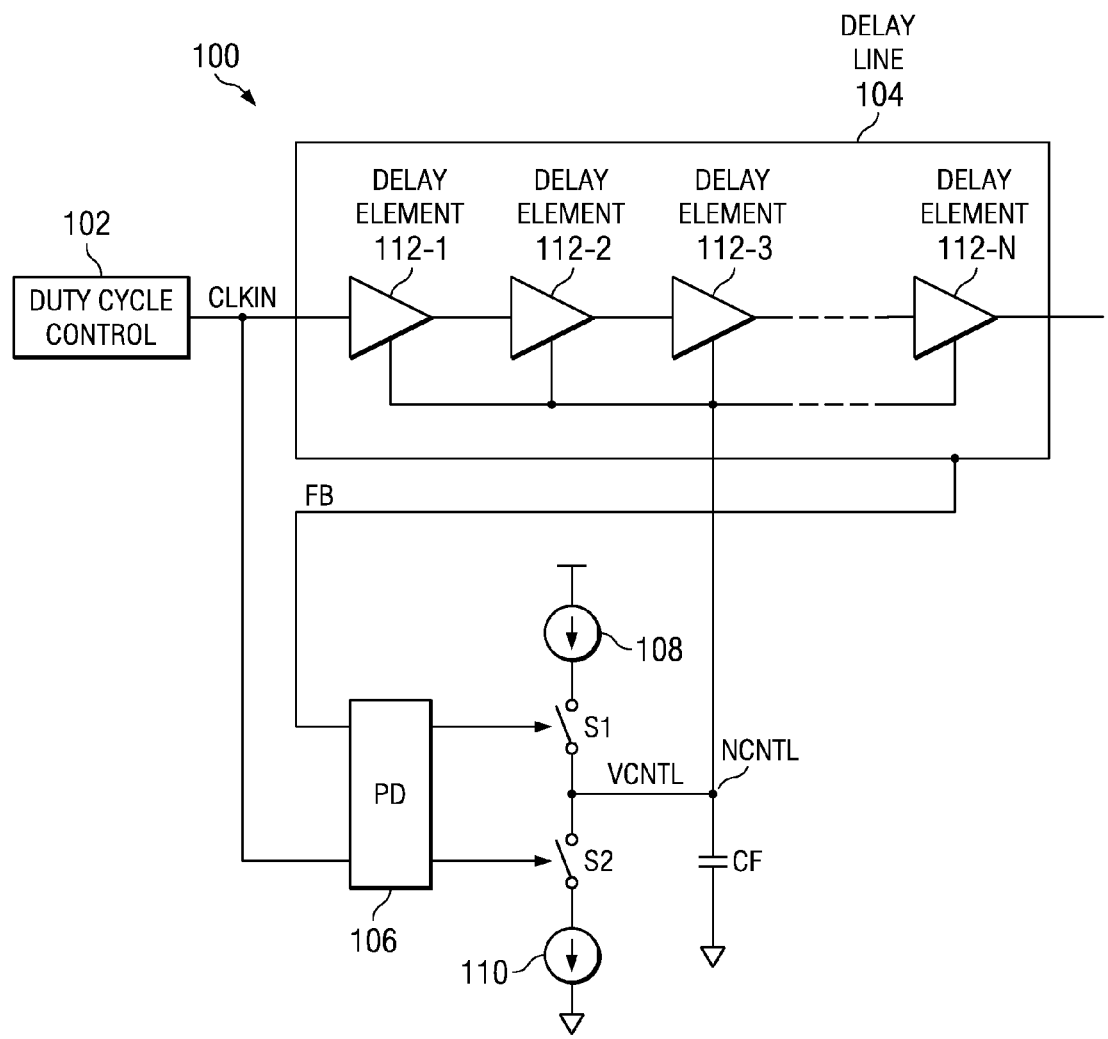
FIG. 1A is an example of a conventional delay locked loop (DLL)

Refer now to the drawings wherein depicted elements are, for the sake of clarity, not necessarily shown to scale and wherein like or similar elements are designated by the same reference numeral through the several views.

Figure 2:
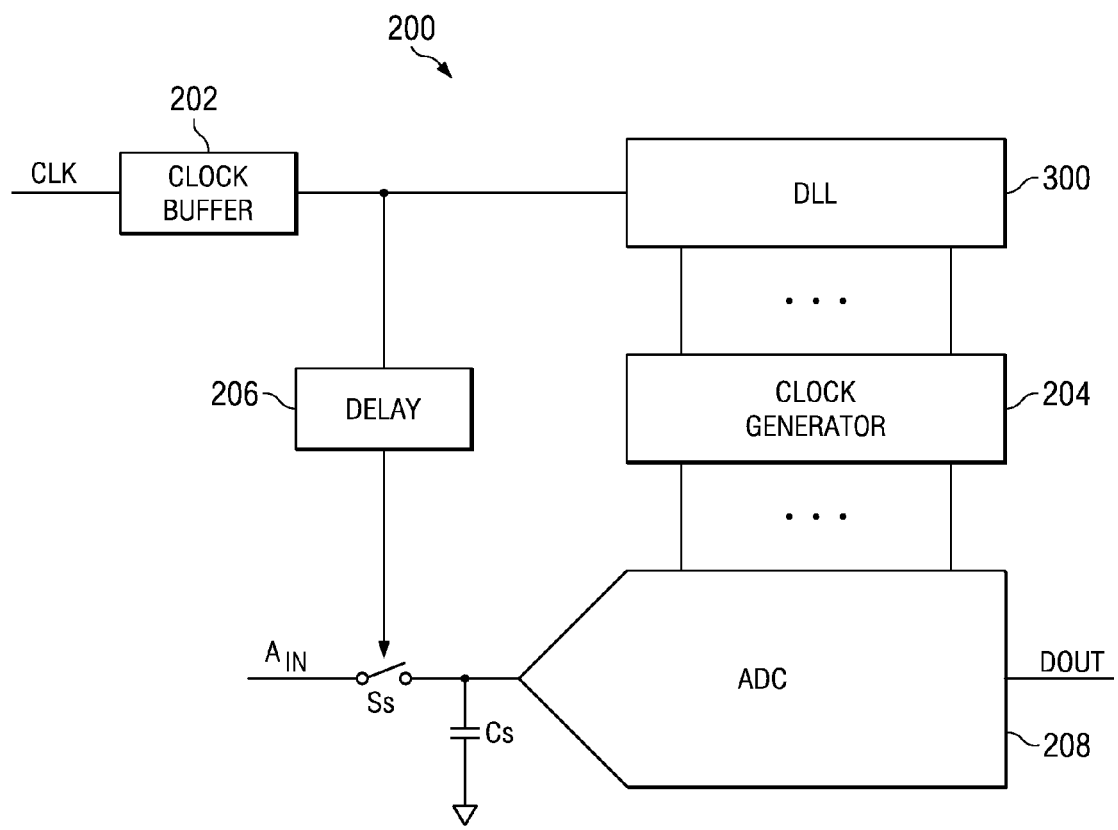
FIG. 2 is an example of a pipelined analog-to-digital converter in accordance with a preferred embodiment of the present invention.

Referring to FIG. 2 of the drawings, reference numeral 200 generally designates a pipelined analog-to-digital converter (ADC) in accordance with a preferred embodiment of the present invention. ADC 200 generally comprises clock circuitry, an ADC 208, and sample-and-hold (S/H) circuitry. The S/H circuitry is generally comprised of a sample switch SS that receives an analog input signal AIN and that is controlled by the clocking circuitry and a sampling capacitor CS that is coupled to the sampling switch SS. The clocking circuitry is generally comprised of clock buffer 202, delay locked loop (DLL) 300, delay circuit 206, and clock generator 204.

In operation, ADC 200 converts the analog input signal AIN to a digital output signal DOUT. The sample switch SS (which is controlled by the delay circuit 206) closes during a sample phase and opens during a hold phase so that the voltage from the analog input signal AIN can be stored on sampling capacitor CS during the sample phase and converted during the hold phase. DLL 300 receives a buffered clock signal from clock buffer (which buffers a clock signal CLK having a period $T_S$) and generates several signals or DLL edges. These DLL edges are converted to clock signals for the ADC 208 by clock generator 204, so that ADC 208 can convert the analog input signal AIN sampled on capacitor CS to the digital output signal DOUT.

Figure 3A:
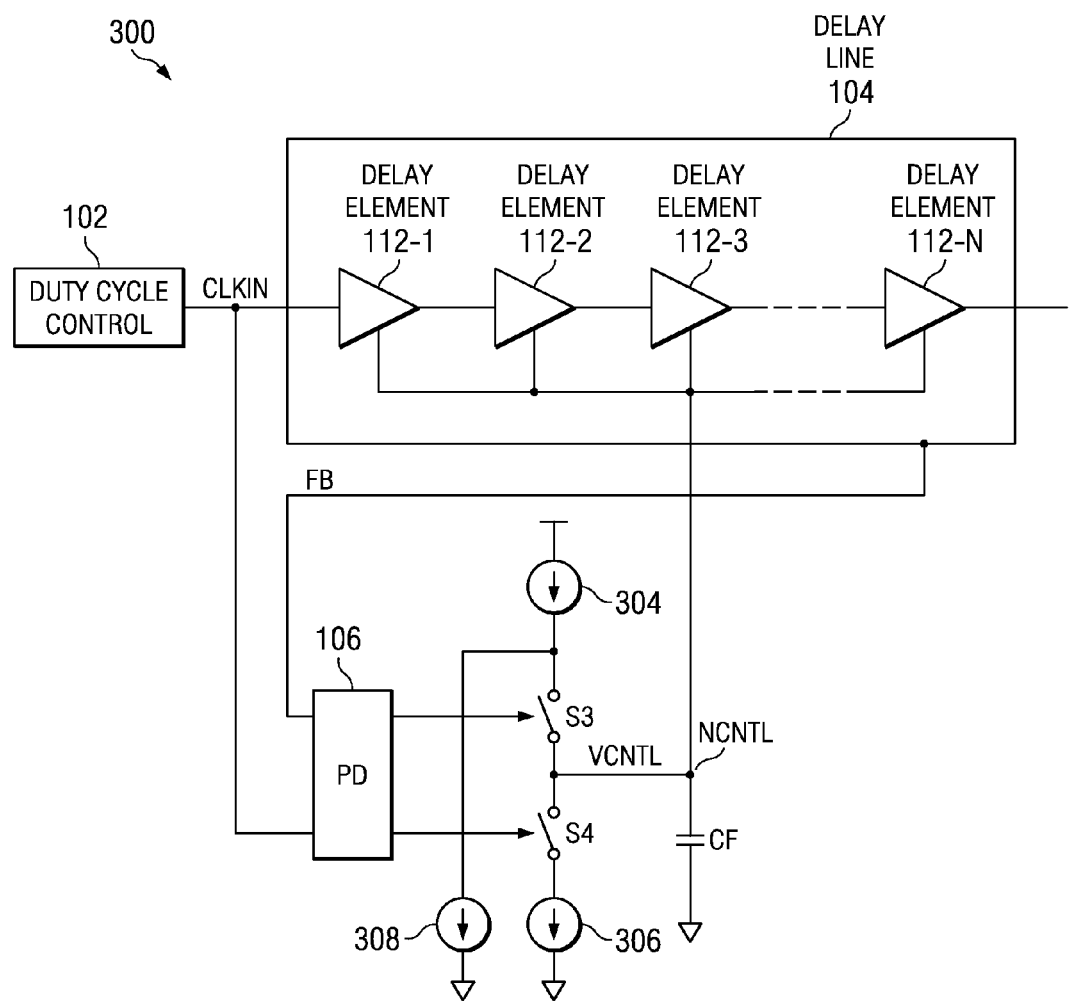
FIG. 3A is an example of the DLL of FIG. 2.

Of interest, however, is the DLL 300, which can be seen in greater detail in FIG. 3A. As with DLL 100, DLL 300 includes a duty cycle controller 102, delay line 104, PD 106, and loop filter (capacitor CF); some differences, though, are in the charge pump. In particular, the charge pump of DLL 300 generally comprises current sources 304, 306, and 308 and switches S3 and S4. Here, current source 304 provides current $I_0$, while current sources 306 and 308 provide current $I_{FS}$, so that the up current $I_{UP}$ is the different between currents $I_0$ and $I_{FS}$ ($I_{UP}=I_0-I_{FS}$) and the down current is $I_{FS}$. As with DLL 100, PD 106 of DLL 300 provides up and down signals to switches S3 and S4, but these up and down signals are not symmetrical in DLL 300 because of the different magnitudes of these currents.

In a conventional DLL (such as DLL 100), the hold time increases with an increasing period $T_S$, so the operating currents of the amplifiers can be reduced with increasing the period $T_S$, resulting in power scaling. But the non-overlap period between the sample phase and the hold phase also keeps increasing with period $T_S$, which is not necessary. So, with DLL 300, clock signals from delay line 104 of DLL 300 are generated such that non-overlap period remains constant across period $T_S$, process, and temperature, so any increase in period $T_S$ results in an increase in the hold time and sample time. Thus, more sample and hold times can be obtained compared to the conventional DLL 100. This means the amplifier currents can be reduced faster with an increasing period $T_S$ to obtain better power scaling than the conventional DLL 100. Also, the increased sampling times at lower speeds improve the performance of the sampling circuit (sampling switch SS and sampling capacitor CS of ADC 200). Another salient feature of DLL 300 is fewer DLL edges are generated, resulting in further reduction in power. Lower number of edges means fewer transitions and low power dissipation, especially at high speeds. Consequently, DLL 300 results in lower power consumption than the conventional DLL 100 at the highest speed of operation and then scales down much faster.

As an example, a comparison between DLL 100 and DLL 300 can be made. As described in the example above, DLL 100 is assumed to have 13 buffers of delay elements (i.e., 112-1 to 112-13). In the DLL 300, 7 buffers or delay elements (i.e., 112-1 to 112-7) in the delay line 104 can be assumed to employ with PD 104 comparing the output of the seventh delay element d7 to clock signal CLKIN. When the DLL 300 has converged, it is desirable to have the output of the seventh delay element d7 to be delayed from clock signal CLKIN by about (for example) 1 ns (referred to as $T_C$). So, the relationship between the up current $I_{UP}$ and down current $I_{DOWN}$ can be established as follows:

$$I_{UP}*T_C = I_{DOWN}*(T_S - T_C) \quad (1)$$

If the up current $I_{UP}$ is chosen to be a constant current (i.e., $I_0$) and a current with the same magnitude as down current $I_{DOWN}$, the equation (1) can be reduced as follows:

$$(I_0 - I_{DOWN})*T_C = I_{DOWN}*(T_S - T_C) \Rightarrow I_{DOWN}*T_S = I_0*T_C \quad (2)$$

Thus, the down current $I_{DOWN}$ is proportional to the speed (i.e., $I_{FS}$), and it is clear that DLL 300 provides, among other features, reduced power consumption as compared to DLL 100.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a phase detector (PD) that receives a first signal and a second signal;
   a charge pump having:
     a plurality of first current sources that supply a first current;
     a first switch that is coupled between each of the first current sources and a control node, wherein the first switch is controlled by the PD;
     a second current source that supplies a second current, wherein the first current is the difference between a generally constant current and the second current; and
     a second switch that is coupled between the second current source and the control node, wherein the second switch is controlled by the PD; and
   a delay line that receives the first signal, that is coupled to the control node, and that is coupled to the PD so as to provide the second signal to the PD.

2. The apparatus of claim 1, wherein the apparatus further comprises a duty cycle controller that receives a clock signal and that is coupled to the delay line and PD so as to provide the first signal to the delay line and PD.

3. The apparatus of claim 1, wherein the delay line further comprises a plurality of delay elements coupled in series with one another, wherein each delay element is coupled to the control node.

4. The apparatus of claim 3, wherein each of the delay elements further comprises a buffer.

5. The apparatus of claim 1, wherein the apparatus further comprises a capacitor that is coupled to the control node.

6. An apparatus comprising:
   sample-and-hold (S/H) circuitry that receive an analog input signal;
   an analog-to-digital converter (ADC) that is coupled to the S/H circuitry; and
   clocking circuitry that is coupled to the S/H circuitry and ADC so as to provide clocking signals to the S/H circuitry and the ADC, wherein the clocking circuitry includes a delay locked loop (DLL) having:
     a PD that receives a first signal and a second signal;
     a charge pump having:
       a first current source;
       a first switch that is coupled between the first current source and a control node, wherein the first switch is controlled by the PD;
       a second current source;
       a second switch that is coupled between the second current source and the control node, wherein the second switch is controlled by the PD; and
       a third current source that is coupled between the first current source and ground;
     a loop filter that is coupled to the control node; and
     a delay line that receives the first signal, that is coupled to the control node, and that is coupled to the PD so as to provide the second signal to the PD.

7. The apparatus of claim 6 wherein the apparatus further comprises a duty cycle controller that receives a clock signal and that is coupled to the delay line and PD so as to provide the first signal to the delay line and PD.

8. The apparatus of claim 7, wherein the delay line further comprises a plurality of delay elements coupled in series with one another, wherein each delay element is coupled to the control node.

9. The apparatus of claim 8, wherein each of the delay elements further comprises a buffer.

10. The apparatus of claim 8, wherein the clocking circuitry further comprises a clock generator that is coupled to each of the delay elements and that is coupled to the ADC.

11. The apparatus of claim 6, wherein the clocking circuitry further comprises a clock buffer that is coupled to the DLL.

12. The apparatus of claim 6, wherein the S/H circuitry further comprises:
   a sampling switch that receives the analog input signal and that is controlled by the clocking circuitry; and
   a sampling capacitor that is coupled to the sampling switch and the ADC.

13. The apparatus of claim 6, wherein the loop filter further comprises a capacitor.

14. An apparatus comprising:
   a sampling switch that receives the analog input signal;
   a sampling capacitor that is coupled to the sampling switch;
   an analog-to-digital converter (ADC) that is coupled to the sampling capacitor;
   a clock buffer;
   a delay circuit that is coupled to the clock buffer and the sampling switch so as to control the sampling switch;
   a delay locked loop (DLL) having:
     a duty cycle controller that is coupled to the clock buffer;
     a PD that is coupled to the duty cycle controller;
     a charge pump having:
       a first current source;
       a first switch that is coupled between the first current source and a control node, wherein the first switch is controlled by the PD;
       a second current source;

a second switch that is coupled between the second current source and the control node, wherein the second switch is controlled by the PD; and a third current source that is coupled between the first current source and ground;

a capacitor that is coupled between the control node and ground; and a plurality of delay elements coupled in series with one another, wherein each delay element is coupled to the control node, and wherein at least one of the delay elements is coupled to the duty cycle controller, and wherein at least one of the delay elements is coupled to the PD; and a clock generator coupled to each of the delay elements and coupled to the ADC.

15. The apparatus of claim 14, wherein each of the delay elements further comprises a buffer.

* * * * *